United States Patent
Lee et al.

(10) Patent No.: US 9,786,229 B2
(45) Date of Patent: Oct. 10, 2017

(54) FLEXIBLE DISPLAY DEVICE AND METHOD FOR FABRICATING THE SAME

(71) Applicant: LG DISPLAY CO., LTD., Seoul (KR)

(72) Inventors: HoYoung Lee, Paju-si (KR); ChangHeon Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 79 days.

(21) Appl. No.: 14/572,232

(22) Filed: Dec. 16, 2014

(65) Prior Publication Data

US 2015/0187279 A1  Jul. 2, 2015

(30) Foreign Application Priority Data

Dec. 31, 2013  (KR) .................. 10-2013-0169271

(51) Int. Cl.

| G09G 3/32 | (2016.01) |
|---|---|
| H01L 51/52 | (2006.01) |
| H01L 51/00 | (2006.01) |
| H01L 51/56 | (2006.01) |
| H01L 27/32 | (2006.01) |
| G09G 3/3291 | (2016.01) |
| G09G 3/3225 | (2016.01) |

(52) U.S. Cl.
CPC ......... *G09G 3/3291* (2013.01); *G09G 3/3225* (2013.01); *H01L 27/3276* (2013.01); *H01L 51/0097* (2013.01); *H01L 51/5203* (2013.01); *H01L 51/56* (2013.01); *G09G 2300/0426* (2013.01); *G09G 2380/02* (2013.01); *H01L 2227/323* (2013.01); *H01L 2251/5338* (2013.01); *H01L 2251/5392* (2013.01)

(58) Field of Classification Search
CPC ................... H01L 2251/5392; H01L 27/3276
See application file for complete search history.

(56) References Cited

U.S. PATENT DOCUMENTS

| 2003/0027369 A1 | 2/2003 | Yamazaki |
| 2010/0277443 A1 | 11/2010 | Yamazaki et al. |
| 2013/0002583 A1* | 1/2013 | Jin ........................ G06F 1/1637 345/173 |
| 2013/0299789 A1 | 11/2013 | Yamazaki et al. |

(Continued)

FOREIGN PATENT DOCUMENTS

| CN | 1479270 A | 3/2004 |
| CN | 102855822 A | 1/2013 |
| KR | 10-2013-0125715 A | 11/2013 |

*Primary Examiner* — Shaun Campbell
*Assistant Examiner* — Aneta Cieslewicz
(74) *Attorney, Agent, or Firm* — Birch, Stewart, Kolasch & Birch, LLP

(57) ABSTRACT

Provided is a flexible display device including: a display region including pixels to display images, each pixel including an organic light emitting diode (OLED) configured to receive a signal from a signal line and power from a power line to display the images; a non-display region outside the display region where images are not to be displayed, the non-display region including: a circuit mount region including therein a driving circuit configured to supply the signal through the signal line and the power through the power line to each pixel; and a bending region formed between the display region and the circuit mount region and configured to be bent flexibly, wherein the signal line and the power line are formed on a same layer in the bending region.

19 Claims, 10 Drawing Sheets

(56) References Cited

U.S. PATENT DOCUMENTS

2014/0042406 A1\* 2/2014 Degner ................ H01L 27/326
 257/40
2014/0254111 A1\* 9/2014 Yamazaki ........... H01L 51/0097
 361/749

\* cited by examiner

FLEXIBLE DISPLAY DEVICE AND METHOD FOR FABRICATING THE SAME

CROSS-REFERENCE TO RELATED APPLICATION

This application claims the benefit of and priority to Korean Patent Application No. 10-2013-0169271, filed on Dec. 31, 2013, which is hereby incorporated by reference for all purposes as if fully set forth herein.

BACKGROUND OF THE DISCLOSURE

1. Field of the Disclosure

The present disclosure relates to a flexible display device, and particularly, to a flexible display device capable of preventing disconnection or short-circuiting of wires that may occur at a bending area during a bending process for a minimized bezel width, in an organic light-emitting diode display manufactured using a flexible substrate, and a method for fabricating the same.

2. Description of the Related Art

Among flat panel display devices proposed to replace the conventional cathode ray tube, an organic light-emitting diode (OLED) display has a characteristic that a light-emitting diode provided at a display panel has high brightness and a low operation voltage. Such OLED display has advantages that a contrast ratio is large because it is a spontaneous light-emission type, and a very thin display can be implemented. The OLED display can easily implement moving images because a response time is several micro seconds (μs). Further, the OLED display has an unlimited viewing angle, and is stably operated even at a low temperature.

In the OLED display device, display devices are formed on a substrate such as glass. Recently, a flexible organic light-emitting diode (OLED) display device, which is capable of maintaining a display function even when rolled (or bent) like paper due to its flexible material such as plastic or metal foil rather than a non-flexible substrate, has been developed.

FIG. 1 is a planar view schematically illustrating a flexible organic light-emitting diode (OLED) display device in accordance with the conventional art, and FIG. 2A is an enlarged view of part 'A' in FIG. 1.

Referring to FIGS. 1 and 2A, the conventional flexible OLED display device 1 is formed on a flexible substrate 10 including an active area (A/A) and a non-active area (N/A).

The active area (A/A) is a region where an image is substantially displayed. A plurality of pixels (P) are arranged in the active area (A/A), in the form of matrices. Each of the pixels (P) includes a switching transistor (ST1), a driving transistor (DT), a sensing transistor (ST2), a capacitor (C), and an organic light-emitting diode (OLED).

The switching transistor (ST1) of the pixel (P) is connected to a gate line (GL) and a data line (DL) which are formed in the active area (A/A) so as to cross each other. The driving transistor (DT) is connected to a driving voltage line 14b for supplying a driving voltage (VDD) to the pixel (P) in the active area (A/A). The sensing transistor (ST2) is connected to a reference voltage line 14a for supplying a reference voltage (Vref) to the pixel (P) in the active area (A/A).

The non-active area (N/A) is a region formed around the active area (A/A), and is covered by a bezel portion, etc. Driving circuitry for driving the pixels (P) in the active area (A/A) and wires may be formed in the non-active area (N/A).

The driving circuitry includes a data driving portion 20, a gate driving portion 13 and a light-emitting controller (not shown). The data driving portion 20 is mounted at a lower end non-active area (N/A) in the form of a chip. The gate driving portion 13 and the light-emitting controller are formed at one or more sides of the non-active area (N/A), in the form of a gate in panel (GIP).

Wires include power lines 14a~14c, and signal lines GSL, DSL. The power lines 14a~14c includes a driving voltage line 14a, a reference voltage line 14b and a ground line 14c. Also, the signal lines GSL, DSL include a gate signal line (GSL), a data signal line (DSL) and a light-emitting signal line (not shown).

The driving voltage line 14a outputs a driving voltage (VDD) provided from the data driving portion 20 to the pixel (P) in the active area (A/A). The reference voltage line 14b outputs a reference voltage (Vref) provided from the data driving portion 20 to the pixel (P) in the active area (A/A). The ground line 14c outputs a ground voltage (GND) provided from the data driving portion 20 to the pixel (P) in the active area (A/A).

The driving voltage line 14a, the reference voltage line 14b and the ground line 14c include a region vertically extending from the data driving portion in the lower end non-active area (N/A), and a region formed in parallel to the data driving portion 20.

That is, the driving voltage line 14a, the reference voltage line 14b and the ground line 14c are extending from the data driving portion 20 in a vertical direction, at a region adjacent to the data driving portion 20 in the lower end non-active area (N/A). The driving voltage line 14a, the reference voltage line 14b and the ground line 14c are formed as bars, in parallel to the data driving portion 20, at a region adjacent to the active area (A/A) in the lower end non-active area (N/A).

The gate signal line (GSL) outputs a gate signal provided from the data driving portion 20 to the gate driving portion 13. The data signal line (DSL) outputs a data signal provided from the data driving portion 20 to the data line (DL) in the active area (A/A). The light-emitting signal line outputs a light-emitting signal provided from the data driving portion 20 to the light-emitting controller.

In accordance with one embodiment, these wires may be formed to cross each other at least once, in the lower end non-active area (N/A). Thus, the power lines 14a~14c and the signal lines GSL, DSL are formed on different layers, in order to prevent short-circuiting when the wires cross each other.

In the conventional flexible OLED display device 1, the lower end non-active area (N/A) is formed to have a larger width than the rest of the non-active area (N/A). A bending area (B/A) is formed in the lower end non-active area (N/A), and part of the lower end non-active area (N/A) is bent to a rear surface of the flexible OLED display device 1. Under such configuration, the width of the lower end non-active area (N/A) can be reduced.

FIG. 2B is a cross-sectional view of the flexible OLED display device of FIG. 1, which illustrates a bent state.

Referring to FIG. 2B, reference numeral 11 denotes an organic light-emitting diode (OLED) formed in an active area (A/A), and reference numeral 12 denotes an encapsulation layer for encapsulating an OLED.

Referring to FIG. 2B, in the conventional flexible OLED display device 1, the lower end non-active area (N/A) is bent based on a bending area (B/A), so that part of the lower end non-active area (N/A) can be positioned on a rear surface of the flexible OLED display device 1. A curvature radius (R) of the bending area (B/A) is about 0.3 mm.

As mentioned above with reference to FIG. 2A, in the lower end non-active area (N/A) of the conventional flexible OLED display device 1, wires are formed to cross each other. Thus, the power lines 14a~14c and the signal lines GSL, DSL are formed on different layers.

However, because the wires are formed to cross each other even in the bending area (B/A), the wires may be disconnected from each other due to bending stress in the bending area (B/A).

FIG. 3 is a cross-sectional view taken along line in FIG. 2B.

Referring to FIG. 3, the signal lines GSL, DSL and the power lines 14a~14c are formed on different layers to thus be insulated from each other.

For instance, a gate signal line (GSL) and a data signal line (DSL) are formed on a flexible substrate 10 with a distance therebetween. A first insulating layer 15 is formed on the gate signal line (GSL) and the data signal line (DSL).

A driving voltage line 14a and a ground line 14c are formed on the first insulating layer 15 with a predetermined gap therebetween. The driving voltage line 14a and the ground line 14c are formed to overlap the gate signal line (GSL) and the data signal line (DSL), respectively. A second insulating layer 16 is formed on the driving voltage line 14a and the ground line 14c.

When the bending area (B/A) is bent with more than a predetermined curvature radius, cracks/breaks may occur at wires due to bending stress as shown in FIG. 3 (indicated by "a" and "b"). This may cause the wires to be disconnected from each other, or the insulating layer may be damaged to cause short-circuiting of the wires.

Such disconnection or short-circuiting of the wires may cause a malfunction of the flexible OLED display device 1.

SUMMARY OF THE DISCLOSURE

Therefore, an aspect of the detailed description is to provide a flexible display device capable of preventing disconnection or short-circuiting of wires, by forming wires in a bending area of a non-active area, on the same layer so as not to cross each other, and a method for fabricating the same.

To achieve these and other advantages and in accordance with the purpose of this specification, as embodied and broadly described herein, there is provided a flexible display device, including: a flexible substrate having an active area where pixels provided with organic light-emitting diodes have been formed, a non-active area formed around the active area, and a bending area formed at a lower part of the non-active area; a data driving portion mounted in the lower end non-active area; a plurality of power lines formed in the lower end non-active area, and configured to supply power signals provided from the data driving portion to the active area; and a plurality of signal lines formed in the lower end non-active area, and configured to supply driving signals provided from the data driving portion to the active area, wherein the plurality of power lines and the plurality of signal lines are formed in the bending area, on the same layer in parallel to each other.

To achieve these and other advantages and in accordance with the purpose of this specification, as embodied and broadly described herein, there is also provided a method for fabricating a flexible display device, the method including: preparing a substrate having an active area, a non-active area, and a bending area formed at a lower part of the non-active area; forming a thin film transistor and an organic light-emitting diode on the active area of the substrate; and forming a plurality of power lines and a plurality of signal lines connected to the active area, on the lower end non-active area of the substrate, wherein the plurality of power lines and the plurality of signal lines are formed in the bending area on the same layer in parallel to each other.

The present invention can have the following advantages.

In the bending area of the non-active area, wires are formed on the same layer in parallel to each other, so as not to overlap or cross each other. As a result, disconnection or short-circuit of the wires, which occurs when the bending area is bent, can be prevented. Thus a malfunction of the flexible display device can be prevented.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF EMBODIMENTS

Description will now be given in detail of the exemplary embodiments of the present invention, with reference to the accompanying drawings. For the sake of brief description with reference to the drawings, the same or equivalent components will be provided with the same reference numbers, and description thereof will not be repeated.

Hereinafter, a flexible display device and a method for fabricating the same according to the present invention will be explained in more detail.

Figure 1:
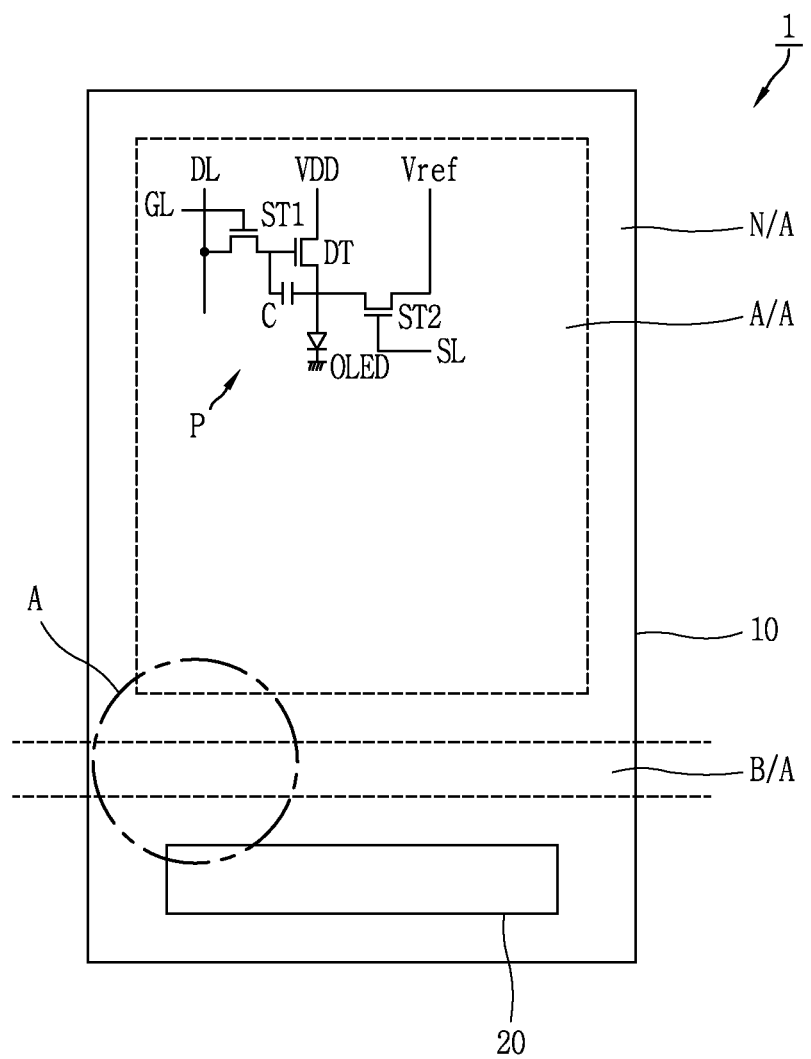
FIG. 1 is a planar view schematically illustrating a flexible organic light-emitting diode (OLED) display device in accordance with the related art.
Figure 2A:
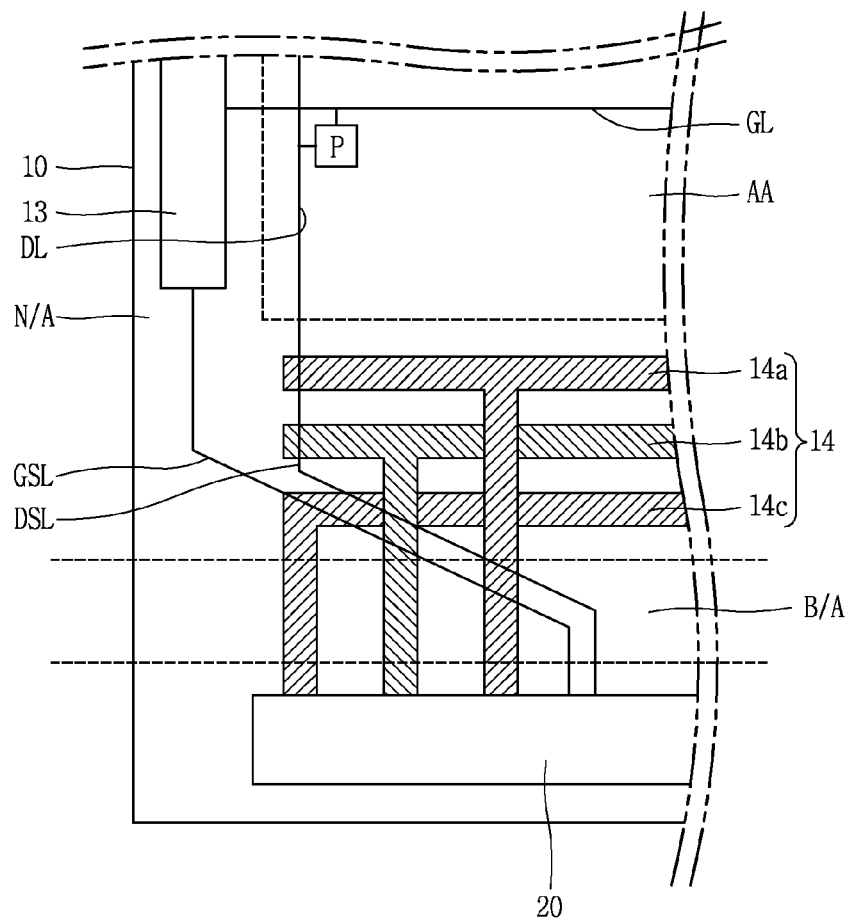
FIG. 2A is an enlarged view of part 'A' in FIG. 1.
Figure 2B:
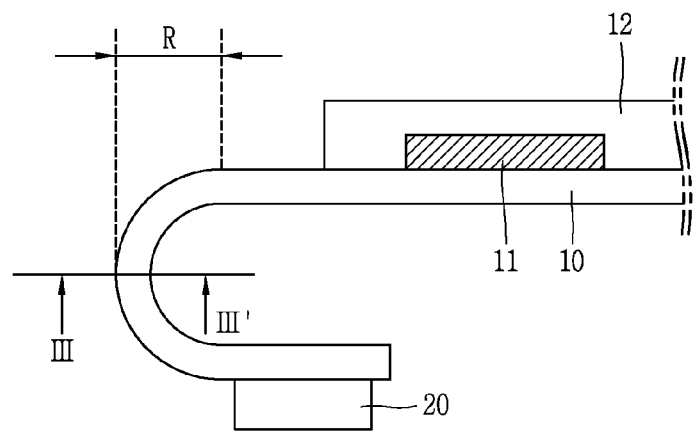
FIG. 2B is a cross-sectional view of the flexible OLED display device of FIG. 1, which illustrates a bent state.
Figure 3:
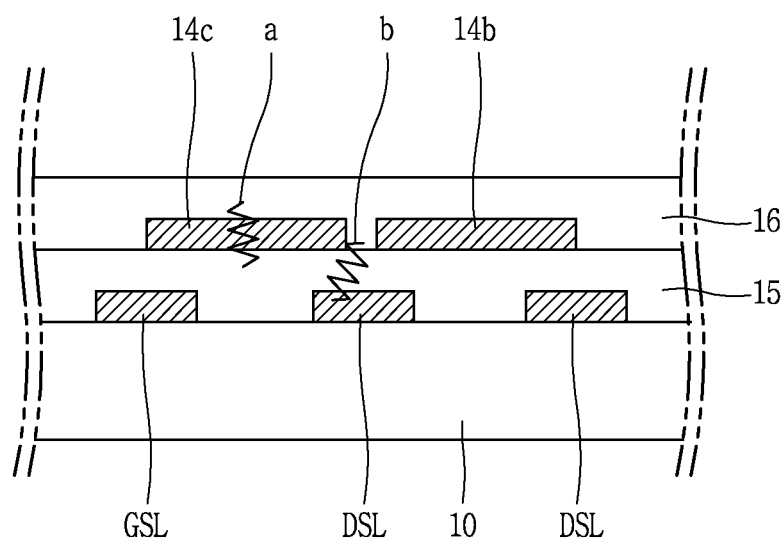
FIG. 3 is a cross-sectional view taken along line III-III' in FIG. 2B.
Figure 4:
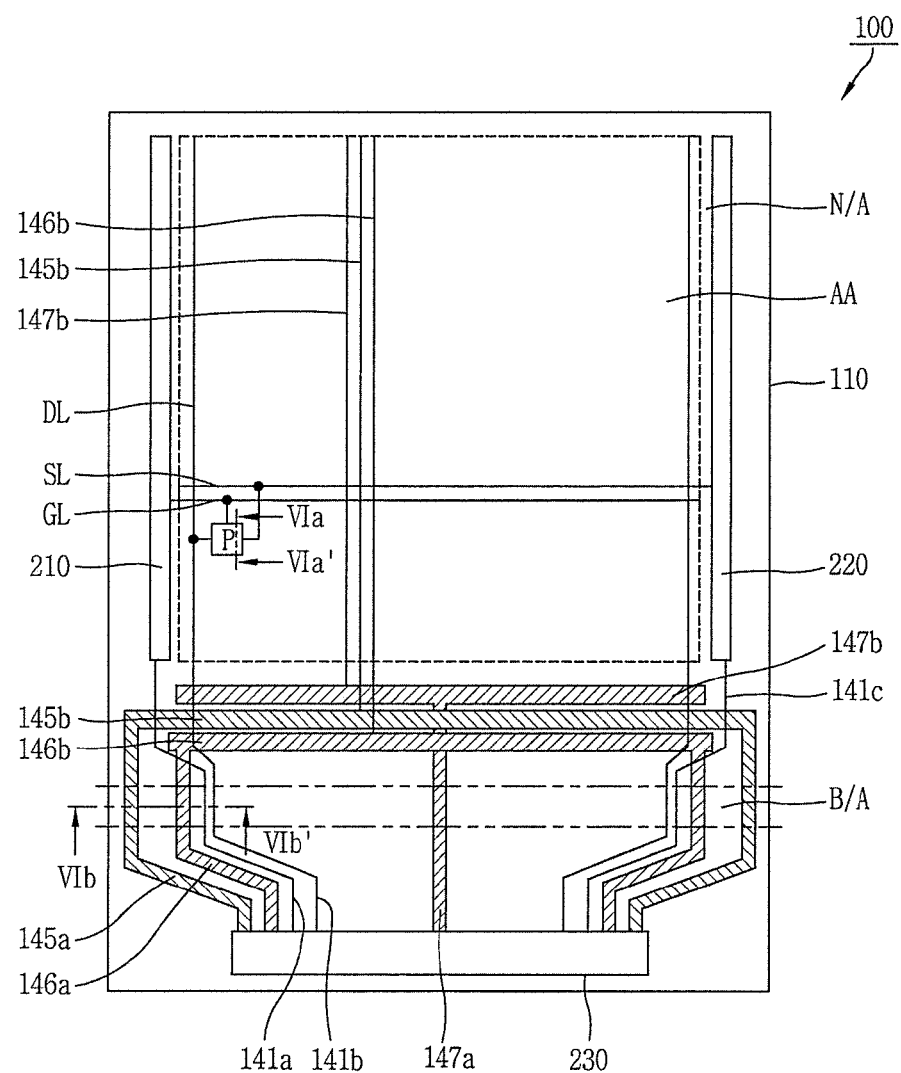
FIG. 4 is a planar view of a flexible OLED display device according to a first embodiment of the present invention.

FIG. 4 is a planar view of a flexible organic light-emitting diode (OLED) display device according to a first embodiment of the present invention.

Referring to FIG. 4, the flexible OLED display device 100 according to a first embodiment of the present invention may be formed on a flexible substrate 110 including an active area (display area) (A/A) and a non-active area (non-display area) (N/A).

The active area (A/A) is a region where an image is substantially displayed. On the active area (A/A), a plurality of gate lines (GL) and a plurality of data lines (DL) may be formed to cross each other, thereby defining pixel regions. A plurality of sensing lines (SL) may be formed in parallel to the plurality of gate lines (GL).

Power lines for supplying a driving voltage (VDD), a reference voltage (Vref) and a ground voltage (GND) to pixel regions, e.g., a driving voltage line 146b, a reference voltage line 147b and a ground line 145b may be formed in the active area (A/A).

A pixel (P) having a plurality of switching devices may be formed at the pixel region. The pixel (P) may operate by being connected to each of the gate line (GL), the data line (DL) and the sensing line (SL).

Figure 5:
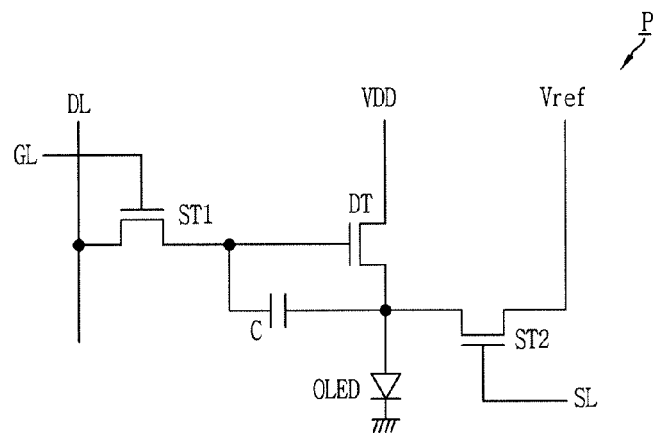
FIG. 5 is an equivalent circuit diagram for a single pixel in the flexible OLED display device of FIG. 4.

FIG. 5 is an equivalent circuit diagram for a single pixel in the flexible OLED display device of FIG. 4.

Referring to FIGS. 4 and 5, the pixel (P) in the active area (A/A) may have a structure where three switching devices (ST1, DT, ST2), one capacitor (C) and one organic light emitting diode (OLED) are formed. However, the present invention is not limited to this configuration. That is, the pixel (P) may be formed to have various structures such as 2T1C, 4T1C, 5T1C and 6T1C.

The switching devices (ST1, DT, ST2) may include a switching transistor (ST1), a driving transistor (DT) and a sensing transistor (ST2). The switching device (ST1, DT, ST2) may be thin film transistors (TFT), for example, formed of amorphous silicon or poly-crystalline silicon.

The switching transistor (ST1) of the pixel (P) may include a gate electrode connected to the gate line (GL) of the active area (A/A), a source electrode connected to the data line (DL), and a drain electrode connected to the driving transistor (DT). The switching transistor (ST1) may output a data signal supplied from the data line (DL) to the driving transistor (DT), according to a gate signal supplied from the gate line (GL).

The driving transistor (DT) of the pixel (P) may include a gate electrode connected to the drain electrode of the switching transistor (ST1), a source electrode connected to an OLED, and a drain electrode connected to driving voltage lines 146a, 146b for supplying a driving voltage (VDD). The driving transistor (DT) may control the size of current applied to the OLED from the driving voltage (VDD), according to a data signal supplied from the switching transistor (ST1).

The capacitor (C) of the pixel (P) may be connected between the gate electrode of the driving transistor (DT) and the OLED. The capacitor (C) may store therein a voltage corresponding to a data signal supplied to the gate electrode of the driving transistor (DT). Also, the capacitor (C) may constantly maintain an 'ON' state of the driving transistor (DT) for a single frame, with the voltage stored therein.

The sensing transistor (ST2) of the pixel (P) may include a gate electrode connected to the sensing line (SL), a source electrode connected to the source electrode of the driving transistor (DT), and a drain electrode connected to reference voltage lines 147a, 147b for supplying a reference voltage (Vref). The sensing transistor (ST2) may sense a threshold voltage (Vth) of the driving transistor (DT), thereby preventing a malfunction of the OLED.

The switching transistor (ST1) of the pixel (P) may be turned on by a gate signal supplied to the gate line (GL), and the capacitor (C) of the pixel (P) may be charged with charges by a data signal supplied to the data line (DL). The amount of current applied to the channel of the driving transistor (DT) may be determined according to a potential difference between a voltage charged at the capacitor (C) and the driving voltage (VDD). The amount of light emitted from the OLED may be determined based on such amount of current. As the OLED emits light, an image is displayed.

The sensing transistor (ST2) may be turned on earlier than the switching transistor (ST1), according to a sensing signal supplied through the sensing line (SL). Under such configuration, electroluminescence of the OLED by the driving voltage (EVDD), which occurs before a data signal is charged at the capacitor (C) during an initial operation of the switching transistor (ST1), can be prevented.

Referring back to FIG. 4, the non-active area (N/A) of the flexible OLED display device 100 may be formed adjacent, for example, around the active area (A/A). Driving circuitry for driving the pixels (P) in the active area (A/A) and wires may be formed in the non-active area (N/A).

The driving circuitry may include a data driving portion 230, a gate driving portion 210 and a light-emitting controller 220.

The data driving portion 230 may be mounted at the non-active area (N/A) below the active area (A/A), in the form of a chip. The data driving portion 230 may generate a data signal by receiving a signal from an external printed circuit board (not shown). The generated data signals may be output to the plurality of data lines (DL) in the active area (A/A) through wires.

The data driving portion 230 may output a gate signal and a light-emitting signal provided from external circuitry, to the gate driving portion 210 and the light-emitting controller 220 through wires, respectively. The data driving portion 230 may output power signals provided from external circuitry, e.g., power signals including a driving voltage (VDD), a reference voltage (Vref), a ground voltage (GND), etc., to driving voltage lines 146a, 146b, reference voltage lines 147a, 147b, and ground lines 145a, 145b, respectively.

The gate driving portion 210 may be formed at one side of the non-active area (N/A) outside the active area (A/A), in the form of a gate in panel (GIP). The gate driving portion 210 may sequentially output gate signals provided from the data driving portion 230 through wires (e.g., gate signal lines 141a), to the plurality of gate lines (GL) in the active area (A/A).

The light-emitting controller 220 may be formed at another side of the non-active area (N/A) outside the active area (A/A), in the form of a gate in panel (GIP) so as to correspond to the gate driving portion 210. The light-emitting controller 220 may sequentially output light-emitting signals provided from the data driving portion 230 through wires (e.g., light-emitting lines 141c), to the plurality of sensing lines (SL) in the active area (A/A).

The wires may include power lines and signal lines formed between the data driving portion 230 and the active area (A/A). The power lines may include driving voltage lines 146a, 146b, reference voltage lines 147a, 147b, and ground lines 145a, 145b. Also, the signal lines may include a gate signal line 141a, a data signal line 141b, and a light-emitting signal line 141c.

The power lines may supply power signals provided from the data driving portion 230, to the active area (A/A). The signal lines may supply driving signals provided from the data driving portion 230, e.g., a gate signal, a data signal and a light-emitting signal, to the active area (A/A), the gate driving portion 210 and the light-emitting controller 220.

The driving voltage lines 146a, 146b may be formed in the lower end non-active area (N/A), and may output a driving voltage (VDD) provided from the data driving portion 230 to the pixel (P) in the active area (A/A).

The driving voltage lines 146a, 146b may include a first driving voltage line 146a and a second driving voltage line 146b. The first driving voltage line 146a connected to the data driving portion 230. The second driving voltage line 146b may be connected to the first driving voltage line 146a and formed as a bar in a direction parallel to the data driving portion 230. The second driving voltage line 146b may be formed such that one side thereof is connected to the first driving voltage line 146a, and another side thereof is extending to the pixel (P) in the active area (A/A). Based on this configuration, the second driving voltage line 146b may output a driving voltage (VDD) provided through the first driving voltage line 146a to each pixel (P).

The reference voltage lines 147a, 147b may be formed in the lower end non-active area (N/A), and may output a reference voltage (Vref) provided from the data driving portion 230 to the pixel (P) in the active area (A/A).

The reference voltage lines 147a, 147b may include a first reference voltage line 147a and a second reference voltage line 147b. The first reference voltage line 147a connected to the data driving portion 230. The second reference voltage line 147b may be connected to the first reference voltage line 147a and formed as a bar in parallel to the second driving voltage line 146b. The second reference voltage line 147b may be formed such that one side thereof is connected to the first reference voltage line 147a, and another side thereof is extending to the pixel (P) in the active area (A/A). Based on this configuration, the second reference voltage line 147b may output a reference voltage (Vref) provided through the first reference voltage line 147a to each pixel (P).

The ground lines 145a, 145b may be formed in the lower end non-active area (N/A), and may output a ground voltage (GND) provided from the data driving portion 230 to the pixel (P) in the active area (A/A).

The ground lines 145a, 145b may include a first ground line 145a and a second ground line 145b. The first ground line 145a connected to the data driving portion 230. The second ground line 145b may be connected to the first ground line 145a, and formed as a bar in parallel to the second driving voltage line 146b and the second reference voltage line 147b. The second ground line 145b may be formed such that one side thereof is connected to the first ground line 145a, and another side thereof is extending to the pixel (P) in the active area (A/A). By this configuration, the second ground line 145b may output a ground voltage (GND) provided through the first ground line 145a to each pixel (P).

The gate signal line 141a may be formed between the data driving portion 230 and the gate driving portion 210 in the lower end non-active area (N/A). The gate signal line 141a may output a gate signal provided from the data driving portion 230 to the gate driving portion 210. The gate signal may be output to the plurality of gate lines (GL) in the active area (A/A), through the gate driving portion 210.

The data signal line 141b may be formed in the lower end non-active area (N/A), between the data driving portion 230 and the data line (DL) in the active area (A/A). The data signal line 141b may output a data signal provided from the data driving portion 230 to the plurality of data lines (DL) in the active area (A/A).

The light-emitting signal line 141c may be formed in the non-active area (N/A) between the data driving portion 230 and the light-emitting controller 220. The light-emitting signal line 141c may output a light-emitting signal provided from the data driving portion 230, to the light-emitting controller 220. The light-emitting signal may be output to the plurality of sensing lines (SL) in the active area (A/A), by the light-emitting controller 220.

In the flexible OLED display device 100 according to this embodiment of the present invention, the lower end non-active area (N/A) may include a bending area (B/A). The bending area (B/A) may be a region which has a predetermined curvature when part of the lower end non-active area (N/A) is bent to the rear or front surface of the flexible OLED display device 100. That is, the bending area (B/A) is a flexible portion including flexible materials that is provided between one end of the display device 100 and the other part of the device 100 and allows the one end to be bent or rotated around the bending area (B/A) toward the front or rear surface of the other part. In accordance with one embodiment, the lower end non-active area (N/A) may be bent around the bending area (B/A) toward the front or rear surface of the flexible OLED display device 100. As an example, the lower end non-active area (N/A) may be attached to the rear surface of the flexible OLED display device 100 by the rotation around the bending area (B/A). Although FIG. 4 shows only one bending area formed adjacent one end of the flexible OLED display device 100, it will be readily appreciable to one skilled in the art that the bending area (B/A) may be formed adjacent any side of the flexible OLED display device 100 (e.g. 4 bending areas formed adjacent 4 sides of the flexible OLED display device 100 in rectangular shape).

The lower end non-active area (N/A) may be divided into three regions by the bending area (B/A). For instance, the lower end non-active area (N/A) may be divided into a first area between the bending area (B/A) and the active area (A/A), the bending area (B/A), and a second area between the bending area (B/A) and an area where the data driving portion 230 has been mounted.

The first area of the lower end non-active area (N/A) may be a region covered by a bezel portion, etc., together with the rest of the non-active area (N/A). Also, the second area may be a region that may be positioned on a rear surface of the flexible OLED display device 100, by bending of the bending area (B/A).

Power lines, which include the second driving voltage line 146b, the second reference voltage line 147b and the second ground line 145b, may be formed in the first area of the lower end non-active area (N/A).

Signal lines, which include the gate signal line 141a, the data signal line 141b and the light-emitting signal line 141c, may be formed in the first area so as to cross the power lines. The signal lines and the power lines in the first area may be formed to overlap each other at different layers on the flexible substrate 110.

Power lines, which include the first driving voltage line 146a, the first reference voltage line 147a and the first ground line 145*a*, may be formed in the bending area (B/A) of the lower end non-active area (N/A).

Signal lines, which include the gate signal line 141*a*, the data signal line 141*b* and the light-emitting signal line 141*c*, may be formed in the bending area (B/A) in parallel to the power lines so as not to cross the power lines. The signal lines and the power lines in the bending area (B/A) may be formed to be spaced from each other on the same layer on the flexible substrate 110.

The power lines, which include the first driving voltage line 146*a*, the first reference voltage line 147*a* and the first ground line 145*a*, may be formed in the second area of the lower end non-active area (N/A).

The signal lines, which include the gate signal line 141*a*, the data signal line 141*b* and the light-emitting signal line 141*c*, may be formed in the second area in parallel to the power lines so as not to cross the power lines. The signal lines and the power lines may be formed to be extending from the data driving portion 230 in parallel to each other. In this case, the signal lines and the power lines may be formed to be in parallel to each other by being bent at least twice in the second area. The signal lines and the power lines in the second area may be formed to be spaced from each other on the same layer.

As mentioned above, in the flexible OLED display device 100 according to this embodiment, wires are formed on the same layer in parallel to each other, in the bending area (B/A) of the lower end non-active area (N/A) where bending is performed. Accordingly, unlike in the conventional art, the occurrence of disconnection of the wires due to bending stress can be prevented.

In the second area and the bending area (B/A) of the lower end non-active area (N/A), wires are formed on the same layer. However, in the first area, wires are formed on different layers. By such configuration, wires formed in the bending area (B/A) may be connected to wires formed on different layers in the first area, through holes (not shown).

Figure 6:
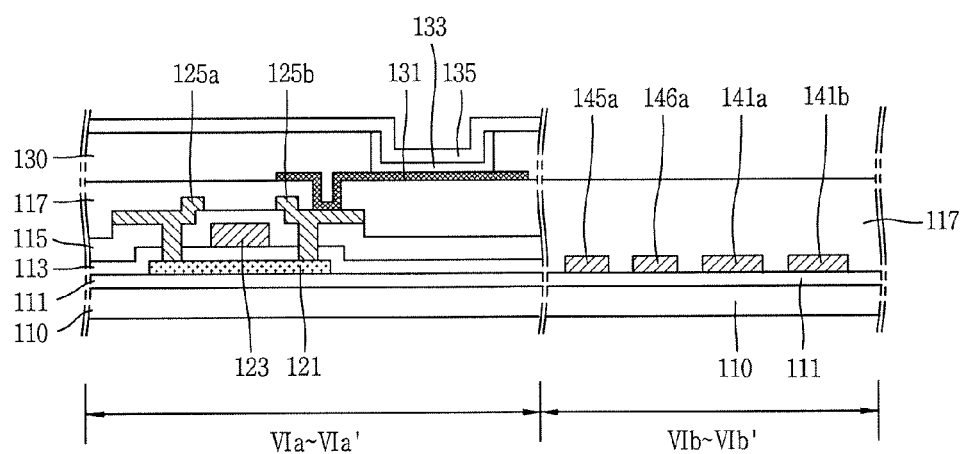
FIG. 6 is a cross-sectional view taken along line VIa~VIa' and VIb~VIb' in the flexible OLED device of FIG. 4.

FIG. 6 is a cross-sectional view taken along line VIa~VIa' and VIb~VIb' in the flexible OLED device of FIG. 4.

Referring to FIGS. 4 and 6, the flexible OLED display device 100 may include pixels (P) formed in the active area (A/A), and wires formed in the non-active area (N/A) (e.g., lower end non-active area (N/A)). The lower end non-active area (N/A) where wires have been formed may be the bending area (B/A).

A thin film transistor (TFT) and an organic light emitting diode (OLED) may be formed on the flexible substrate 110 in the active area (A/A).

For instance, a passivation layer 111 may be formed on the entire surface of the flexible substrate 110. A semiconductor layer 121 formed of amorphous or poly-crystalline silicon may be formed on the passivation layer 111.

A gate insulating layer 113 may be formed on the semiconductor layer 121, and a gate electrode 123 may be formed on the gate insulating layer 113 at a position corresponding to a predetermined region of the semiconductor layer 121.

An interlayer insulating layer 115 may be formed on the gate electrode 123, and a source electrode 125*a* and a drain electrode 125*b* may be formed on the interlayer insulating layer 115.

The source electrode 125*a* and the drain electrode 125*b* may be connected to the semiconductor layer 121, through contact holes (not shown) formed at the interlayer insulating layer 115 and the gate insulating layer 113.

The semiconductor layer 121, the gate electrode 123, the source electrode 125*a* and the drain electrode 125*b* may constitute a thin film transistor in the active area (A/A) of the flexible substrate 110. The TFT may be, for example, a driving transistor of the flexible OLED display device 100. However, the present invention is not limited to this example.

A planarization layer 117 may be formed on the TFT. A first electrode 131, connected to the drain electrode 125*b* through a contact hole (not shown), may be formed on the planarization layer 117.

A pixel defining layer 130, through which part of the first electrode 131 is exposed to the outside, may be formed on the first electrode 131. A light-emitting layer 133 may be formed on the pixel defining layer 130. The light-emitting layer 133 may be formed on the first electrode 131 which has been exposed to the outside by the pixel defining layer 130. A second electrode 135 may be formed on the light-emitting layer 133.

The first electrode 131, the light-emitting layer 133 and the second electrode 135 may constitute an OLED in the active area (A/A) of the flexible substrate 110.

Signal lines and power lines may be formed on the flexible substrate 110 in the bending area (B/A). The signal lines may include the gate signal line 141*a* and the data signal line 141*b*. The power lines may include the first ground line 145*a* and the first driving voltage line 146*a*.

For instance, the passivation layer 111 may be formed on the entire surface of the flexible substrate 110. The gate signal line 141*a*, the data signal line 141*b*, the first ground line 145*a* and the first driving voltage line 146*a* may be formed commonly on the passivation layer 111, such that they are spaced from each other with a predetermined distance therebetween, for example, in parallel to each other.

In accordance with one embodiment, the signal lines and the power lines formed in the bending area (B/A) may be formed of the same metallic material as the source electrode 125*a* and the drain electrode 125*b* formed in the active area (A/A), at the same processing stage.

Like in the active area (A/A), the planarization layer 117 may be formed as an insulating layer on the signal lines and the power lines formed in the bending area (B/A).

As mentioned above, in the flexible OLED display device 100 according to one embodiment, wires may be formed on the same layer in the bending area (B/A), with the same metallic material. Accordingly, even if the planarization layer 117 is damaged by bending stress in the bending area (B/A), the wires in the bending area (B/A) are not disconnected or cracked. This can prevent a malfunction of the flexible OLED display device 100.

Figure 7A:
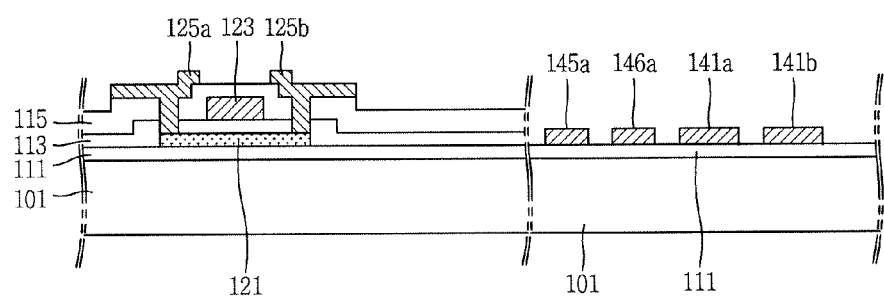
FIGS. 7A to 7C are views illustrating processes of fabricating a flexible OLED display device according to the first embodiment of the present invention.
Figure 7B:
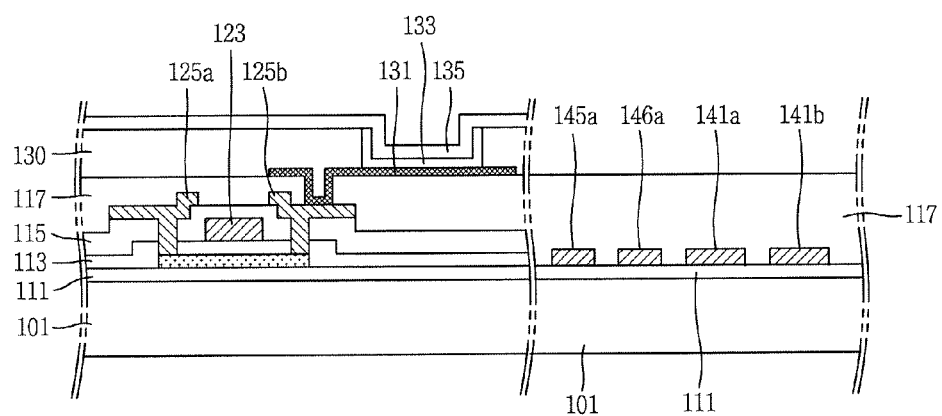
Figure 7C:
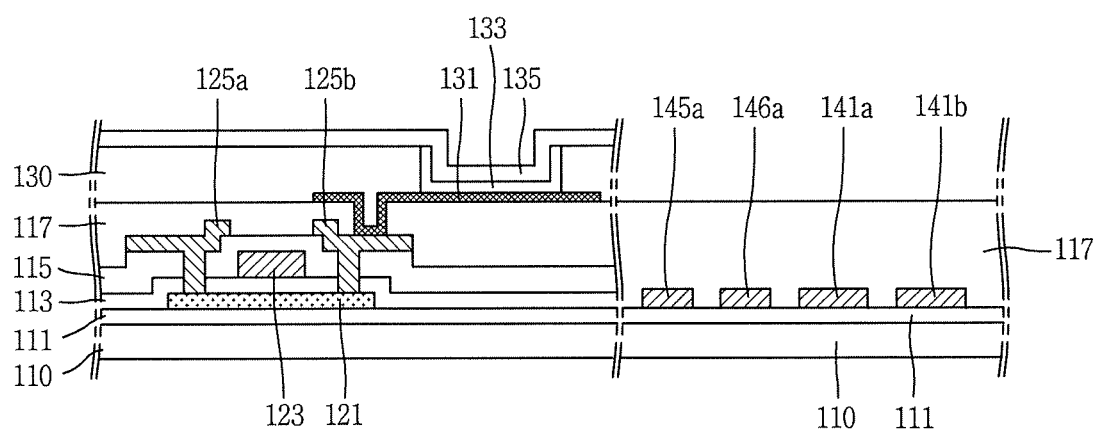

FIGS. 7A to 7C are views illustrating processes of fabricating a flexible OLED display device according to the first embodiment of the present invention.

A passivation layer 111 may be formed on the entire surface of a substrate divided into an active area (A/A) and a non-active area (N/A), e.g., a glass substrate 101. The passivation layer 111 is provided so that thin film transistors, organic light-emitting diodes and wires can be prevented from being damaged during the process of detaching the glass substrate 101, as described below in more detail.

The non-active area (N/A) may include a bending area (B/A) formed below the active area (A/A), i.e., a bending area (B/A) of a lower end non-active area (N/A).

Amorphous silicon or poly-crystalline silicon is deposited in the active area (A/A) on the glass substrate 101 where the passivation layer 111 has been formed. Then the amorphous silicon or the poly-crystalline silicon is selectively patterned, thereby forming a semiconductor layer 121. The semiconductor layer 121 may include a source region and a drain region each including impurities, and a channel region including no impurities.

A gate insulating layer 113 may be formed on the entire surface of the glass substrate 101 where the semiconductor layer 121 has been formed. The gate insulating layer 113 may be formed as a silicon oxide film (SiOx), a silicon nitride film (SiNx), or a multi-layer thereof.

The gate insulating layer 113 may not be formed in the non-active area (N/A) of the glass substrate 101.

A gate electrode 123 may be formed on the gate insulating layer 113, at a position corresponding to a channel region of the semiconductor layer 121. The gate electrode 123 may be formed by depositing a metallic material such as molybdenum (Mo), aluminum (Al), chrome (Cr), titanium (Ti) and copper (Cu), or an alloy thereof, on the gate insulating layer 113, and then by selectively patterning the metallic material or the alloy.

An interlayer insulating layer 115 may be formed on the entire surface of the active area (A/A) of the glass substrate 101 where the gate electrode 123 has been formed. The interlayer insulating layer 115 may be formed as a silicon oxide film (SiOx), a silicon nitride film (SiNx), or a multi-layer thereof.

Contact holes (not shown) may be formed by etching part of the interlayer insulating layer 115 and the gate insulating layer 113, thereby exposing part of the semiconductor layer 121, e.g., a source region and a drain region to the outside therethrough.

A source electrode 125a and a drain electrode 125b may be formed on the interlayer insulating layer 115. The source electrode 125a may be formed so as to be connected to the source region of the semiconductor layer 121 through the contact hole, and the drain electrode 125b may be formed so as to be connected to the drain region of the semiconductor layer 121 through the contact hole.

The source electrode 125a and the drain electrode 125b may be formed by depositing a metallic material such as Ti, Al and Mo, or an alloy thereof such as Ti/Al/Ti and Mo/Al, on the interlayer insulating layer 115, and then by selectively patterning the metallic material or the alloy.

A thin film transistor (TFT) including the semiconductor layer 121, the gate electrode 123, the source electrode 125a and the drain electrode 125b, which is, e.g., a driving transistor of the flexible OLED display device 100, may be formed in the active area (A/A) of the glass substrate 101.

Wires, e.g., a gate signal line 141a, a data signal line 141b, a first ground line 145a and a first driving voltage line 146a may be formed on the passivation layer 111, in the non-active area (N/A) of the glass substrate 101. Such wires may be formed on the passivation layer 111 so as to be spaced from each other with a predetermined interval.

The gate signal line 141a, the data signal line 141b, the first ground line 145a and the first driving voltage line 146a may be formed of the same metallic material as the source electrode 125a and the drain electrode 125b, at the same processing stage.

Referring to FIG. 7B, a planarization layer 117 may be formed on the entire surface of the active area (A/A) where a thin film transistor has been formed, and the non-active area (N/A) where wires have been formed.

The planarization layer 117 may be formed by a spin coating method, for example, the method for coating an organic material or an inorganic material such as polyimide, benzocyclobutene series resin and acrylate, in the form of a liquid phase, and then hardening the material.

A contact hole (not shown) may be formed by etching part of the planarization layer 117 in the active area (A/A), thereby exposing the drain electrode 125b to the outside therethrough.

A first electrode 131 may be formed on the planarization layer 117 in the active area (A/A). The first electrode 131 may be connected to the drain electrode 125b through the contact hole of the planarization layer 117.

The first electrode 131 may be formed of a transparent conductive material such as ITO (Indium Tin Oxide), IZO (Indium Zinc Oxide) or ZnO (Zinc Oxide), which may form the anode of an OLED.

A pixel defining layer 130 may be formed on the first electrode 131. The pixel defining layer 130 may have an opening through which part of the first electrode 131 is exposed to the outside, and may define a pixel region.

The pixel defining layer 130 may be formed by a spin coating method, for example, the method for coating an organic material or an inorganic material such as polyimide, benzocyclobutene series resin and acrylate, in the form of a liquid phase, and then hardening the material.

Referring to FIGS. 7B and 7C, a light-emitting layer 133 may be formed on the pixel defining layer 130. The light-emitting layer 133 may be formed on the opening of the pixel defining layer 130, i.e., may be formed on the first electrode 131 exposed to the outside by the pixel defining layer 130.

A second electrode 135 may be formed on the light-emitting layer 133. The second electrode 135 may be formed of aluminum (Al), silver (Ag), magnesium (Mg), or an alloy thereof by deposition.

An OLED including the first electrode 131, the light-emitting layer 133 and the second electrode 135 may be formed on a TFT of the glass substrate 101 in the active area (A/A).

When a TFT and an OLED have been formed in the active area (A/A) and wires have been formed in the non-active area (N/A), the glass substrate 101 may be detached from the passivation layer 111. Then, a flexible substrate 110 may be attached to the passivation layer 111.

The flexible substrate 110 may have the same active area (A/A) and non-active area (N/A) as the glass substrate 101.

The flexible substrate 110 may be formed, for example, of one of polycarbon, polyimide, polyether sulfone (PES), polyarylate, polyethylene naphthalate (PEN) or polyethylenetherephthalate (PET).

The glass substrate 101 may be detached from the passivation layer 111 through irradiation of laser, etc., and the flexible substrate 110 may be attached to the passivation layer 111 by an adhesive tape such as an optically clear adhesive (OCA), with reference to FIG. 7C.

Figure 8:
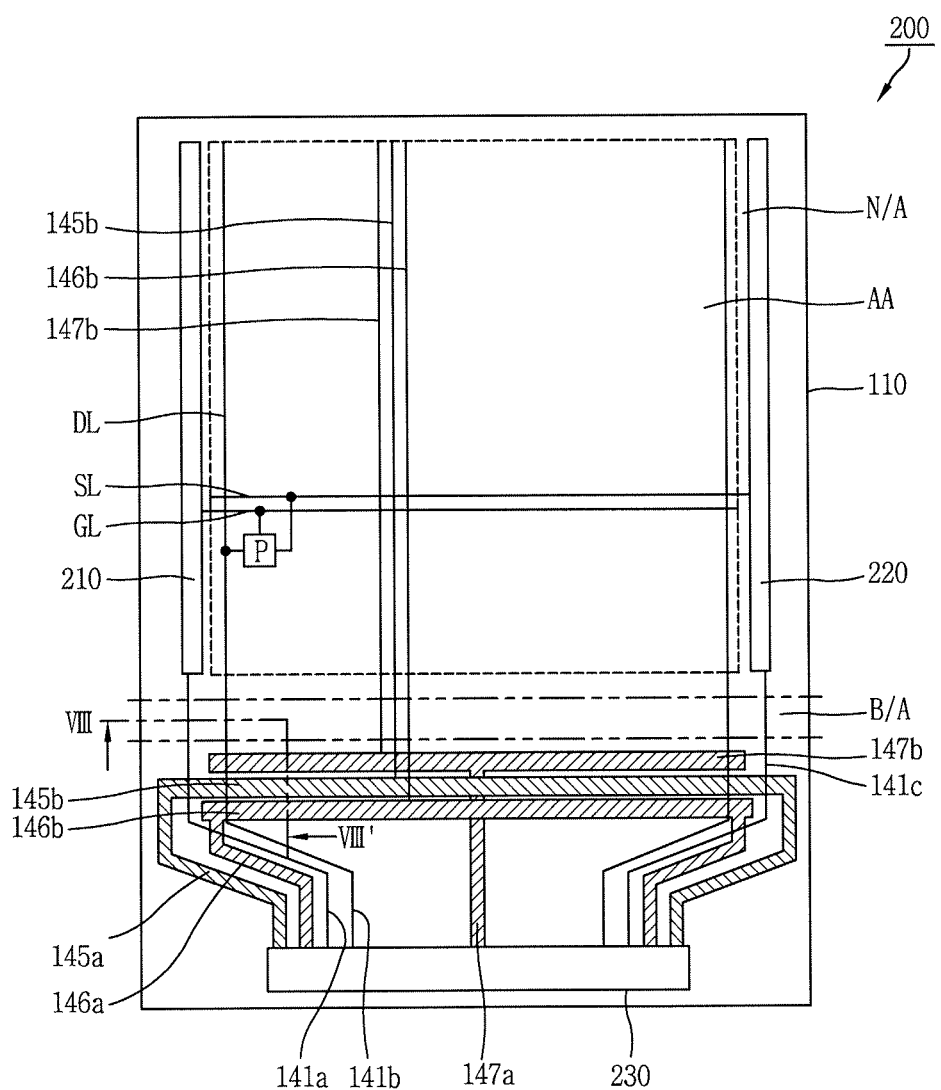
FIG. 8 is a planar view of a flexible OLED display device according to a second embodiment of the present invention.

FIG. 8 is a planar view of a flexible OLED display device according to a second embodiment of the present invention.

Referring to FIG. 8, the flexible OLED display device according to the second embodiment may be formed on a flexible substrate 110 having an active area (A/A) and a non-active area (N/A).

The active area (A/A) is a region where an image is substantially displayed. On the active area (A/A), a plurality of gate lines (GL) and a plurality of data lines (DL) may be formed to cross each other, thereby defining pixel regions. A plurality of sensing lines (SL) may be formed in parallel to the plurality of gate lines (GL).

Power lines for supplying a driving voltage (VDD), a reference voltage (Vref) and a ground voltage (GND) to pixel regions, e.g., a driving voltage line 146b, a reference voltage line 147b and a ground line 145b may be formed in the active area (A/A).

A pixel (P) having a plurality of switching devices may be formed at the pixel region. The pixel (P) may be the same pixel as described above with reference to FIG. 5.

The non-active area (N/A) of the flexible OLED display device 200 may be formed around the active area (A/A), which may be defined by the dotted line. Driving circuitry for driving the pixels (P) in the active area (A/A) and wires may be formed in the non-active area (N/A).

The driving circuitry may include a data driving portion 230, a gate driving portion 210 and a light-emitting controller 220.

The data driving portion 230 may be mounted in the non-active area (N/A) positioned below the active area (A/A), i.e., the lower-end non-active area (N/A). The gate driving portion 210 and the light-emitting controller 220 may be formed in the non-active area (N/A), i.e., at two sides outside the active area (A/A), in the form of a gate in panel (GIP).

The data driving portion 230 may generate a data signal by receiving a signal from an external circuit. The generated data signal may be output to the plurality of data lines (DL) in the active area (A/A) through wires. The gate driving portion 210 may output a gate signal provided from the data driving portion 230, to the plurality of gate lines (GL) in the active area (A/A), through wires. The light-emitting controller 220 may output a light-emitting signal provided from the data driving portion 230, to the plurality of sensing lines (SL) in the active area (A/A), through wires.

Wires may include power lines including driving voltage lines 146a, 146b, reference voltage lines 147a, 147b, and ground lines 145a, 145b, and signal lines including a gate signal line 141a, a data signal line 141b, and a light-emitting signal line 141c.

The driving voltage lines 146a, 146b may be formed in the lower end non-active area (N/A), and may output a driving voltage (VDD) provided from the data driving portion 230 to the pixel (P) in the active area (A/A).

The driving voltage lines 146a, 146b may include a first driving voltage line 146a and a second driving voltage line 146b. The first driving voltage line 146a connected to the data driving portion 230. The second driving voltage line 146b may be connected to the first driving voltage line 146a, and formed as a bar in a direction parallel to the data driving portion 230. The second driving voltage line 146b may be formed such that one side thereof is connected to the first driving voltage line 146a, and another side thereof is extending to the pixel (P) in the active area (A/A). Based on this configuration, the second driving voltage line 146b may output a driving voltage (VDD) provided through the first driving voltage line 146a to each pixel (P).

The reference voltage lines 147a, 147b may be formed in the lower end non-active area (N/A), and may output a reference voltage (Vref) provided from the data driving portion 230 to the pixel (P) in the active area (A/A).

The reference voltage lines 147a, 147b may include a first reference voltage line 147a and a second reference voltage line 147b. The first reference voltage line 147a connected to the data driving portion 230. The second reference voltage line 147b may be connected to the first reference voltage line 147a, and formed as a bar in parallel to the second driving voltage line 146b. The second reference voltage line 147b may be formed such that one side thereof is connected to the first reference voltage line 147a, and another side thereof is extending to the pixel (P) in the active area (A/A). Based on this configuration, the second reference voltage line 147b may output a reference voltage (Vref) provided through the first reference voltage line 147a to each pixel (P).

The ground lines 145a, 145b may be formed in the lower end non-active area (N/A), and may output a ground voltage (GND) provided from the data driving portion 230 to the pixel (P) in the active area (A/A).

The ground lines 145a, 145b may include a first ground line 145a and a second ground line 145b. The first ground line 145a may be connected to the data driving portion 230. Further, the second ground line 145b may be connected to the first ground line 145a, and formed as a bar in a direction parallel to the second driving voltage line 146b and the second reference voltage line 147b. The second ground line 145b may be formed such that one side thereof is connected to the first ground line 145a, and another side thereof is extending to the pixel (P) in the active area (A/A). Based on this configuration, the second ground line 145b may output a ground voltage (GND) provided through the first ground line 145a to each pixel (P).

The gate signal line 141a may be formed in the lower end non-active area (N/A), between the data driving portion 230 and the gate driving portion 210. The gate signal line 141a may output a gate signal provided from the data driving portion 230 to the gate driving portion 210. The gate signal may be output to the plurality of gate lines (GL) in the active area (A/A), through the gate driving portion 210.

The data signal line 141b may be formed in the lower end non-active area (N/A), between the data driving portion 230 and the data line (DL) in the active area (A/A). The data signal lines 141b may output data signals provided from the data driving portion 230 to the plurality of data lines (DL) in the active area (A/A).

The light-emitting signal line 141c may be formed in the non-active area (N/A), between the data driving portion 230 and the light-emitting controller 220. The light-emitting signal line 141c may output a light-emitting signal provided from the data driving portion 230, to the light-emitting controller 220. The light-emitting signal may be output to the plurality of sensing lines (SL) in the active area (A/A), by the light-emitting controller 220.

In the flexible OLED display device 200 according to the second embodiment of the present invention, the lower end non-active area (N/A) may include a bending area (B/A). The bending area (B/A) may be a region which has a predetermined curvature when part of the lower end non-active area (N/A) is bent to the front or rear surface of the flexible OLED display device 200.

The lower end non-active area (N/A) may be divided, for example, into three regions by the bending area (B/A). For instance, the lower end non-active area (N/A) may be divided into a first area between the bending area (B/A) and the active area (A/A), the bending area (B/A), and a second area between the bending area (B/A) and an area where the data driving portion 230 has been mounted.

The first area of the lower end non-active area (N/A) may be a region covered by a bezel portion, etc., together with the rest of the non-active area (N/A). Also, the second area may be a region positioned on the rear surface of the flexible OLED display device 200, by bending of the bending area (B/A).

The plurality of data signal lines 141b and the plurality of power lines may be formed in the first area. The plurality of power lines include the second driving voltage line 146b, the second reference voltage line 147b and the second ground line 145b. The plurality of data signal lines 141b may be connected to the plurality of data lines (DL) in the active area (A/A). The plurality of data signal lines 141*b* and the plurality of power lines may be formed in the first area in parallel with each other.

In the bending area (B/A) of the lower end non-active area (N/A), the plurality of data signal lines 141*b* and the plurality of power lines formed in the first area, may be formed in parallel with each other.

In the bending area (B/A) of the lower end non-active area (N/A), the plurality of lines extending from the power lines toward the active area (A/A), the plurality of data signal lines 141*b*, the gate signal lines 141*a* and the light-emitting signal lines 141*c* may be formed so as to be spaced from each other on the same layer on the flexible substrate 110.

In the second area of the lower-end non-active area (N/A), signal lines including the gate signal lines 141*a*, the data signal lines 141*b* and the light-emitting signal lines 141*c* may be formed to cross power lines. The power lines, which may have a bar shape, may include first and second driving voltage lines 146*a*, 146*b*, first and second reference voltage lines 147*a*, 147*b*, and first and second ground lines 145*a*, 145*b*. The signal lines and the power lines in the second area may be formed to overlap each other on different layers on the flexible substrate 110.

The signal lines and the power lines may be formed to be in parallel to each other in the first area and the bending area (B/A), by being bent at least twice in the second area.

That is, in the flexible OLED display device 200 according to the second embodiment, a plurality of signal lines and a plurality of power lines may be formed to cross each other in the second area positioned on the rear surface of the flexible OLED display device 200 when the bending area (B/A) of the lower end non-active area (N/A) is bent toward the rear surface of the device 200. Thus, in the flexible OLED display device 200 according to the second embodiment, the width of the lower end non-active area (N/A) can be more reduced than in the conventional flexible OLED display device. As a result, the flexible OLED display device 200 according to the second embodiment can have a narrow bezel portion.

As mentioned above, in the flexible OLED display device 200 according to the second embodiment, a plurality of signal lines and a plurality of power lines are formed on the same layer in parallel to each other, in the bending area (B/A) of the lower end non-active area (N/A). Accordingly, unlike in the conventional art, disconnection of the wires can be prevented even if an insulating layer is damaged due to bending stress.

In the first area and the bending area (B/A) of the lower end non-active area (N/A), wires are formed on the same layer in accordance with one embodiment of the invention. However, in the second area, wires may be formed on different layers. Based on this configuration, wires formed on different layers in the second area may be connected to wires formed on the same layer in the bending area (B/A), through holes (not shown).

Figure 9:
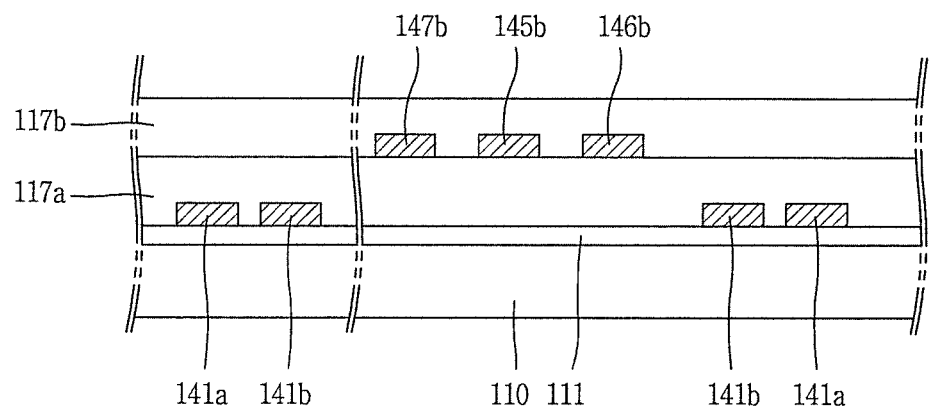
FIG. 9 is a cross-sectional view taken along line VII-I~VIII' in the flexible OLED display device of FIG. 8.

FIG. 9 is a cross-sectional view taken along line VII-I~VIII' in the flexible OLED display device of FIG. 8.

Referring to FIGS. 8 and 9, in the bending area (B/A) of the lower end non-active area (N/A) of the flexible OLED display device 200, a plurality of wires may be formed on the same layer in a spaced manner from each other.

For instance, in the bending area (B/A), a passivation layer 111 is formed on a flexible substrate 110. A gate signal line 141*a*, a data signal line 141*b*, a second ground line 145*b* and a second driving voltage line 146*b* may be formed on the passivation layer 111, such that they are spaced from each other with predetermined distances, in parallel to each other.

A first insulating layer 117*a* may be formed on the gate signal line 141*a*, the data signal line 141*b*, the second ground line 145*b* and the second driving voltage line 146*b*.

A plurality of wires may be formed to overlap each other on different layers, in the second area positioned on the rear surface of the flexible OLED display device 200 when the bending area (B/A) of the lower end non-active area (N/A) is bent.

For instance, in the second area, a passivation layer 111 is formed on a flexible substrate 110. A gate signal line 141*a* and a data signal line 141*b* may be formed on the passivation layer 111, such that they are spaced from each other in parallel to each other.

A first insulating layer 117*a* may be formed on the gate signal line 141*a* and the data signal line 141*b*. A second ground line 145*b* and a second driving voltage line 146*b* may be formed on the first insulating layer 117*a*, with a predetermined distance therebetween in parallel to each other. In this case, the second ground line 145*b* and the second driving voltage line 146*b* may be formed to overlap the gate signal line 141*a* and the data signal line 141*b*.

A second insulating layer 117*b* may be formed on the second ground line 145*b* and the second driving voltage line 146*b*.

In the flexible OLED display device 200 according to the second embodiment, the pixel region in the active area (A/A) has the same cross-sectional profile as the pixel region described above with reference to FIG. 6, of which description is not repeated.

A plurality of wires formed in the non-active area (N/A) may be formed of the same metallic material as a source electrode (not shown) and a drain electrode (not shown) in the pixel region, at the same processing stage. The plurality of wires indicate power lines including the second ground line 145*b* and the second driving voltage line 146*b*, and signal lines including the gate signal line 141*a* and the data signal line 141*b*. For instance, the plurality of wires may be formed of a metallic material such as Ti, Al and Mo or an alloy thereof such as Ti/Al/Ti and Mo/Al.

Figure 10:
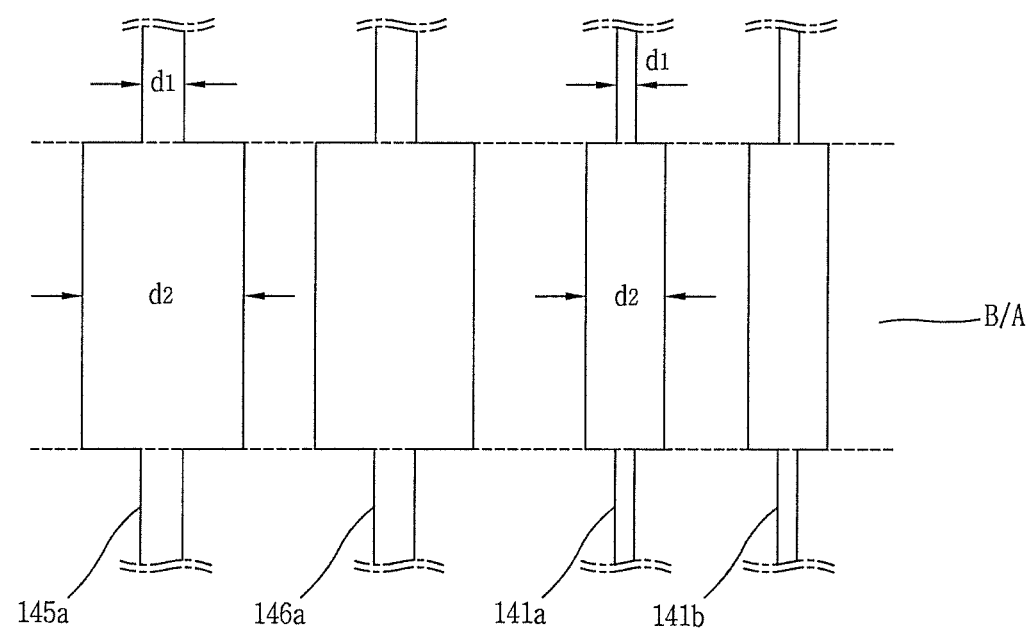
FIG. 10 is a view illustrating a wire structure in a bending area in a flexible OLED display device according to the present invention.
Figure 11:
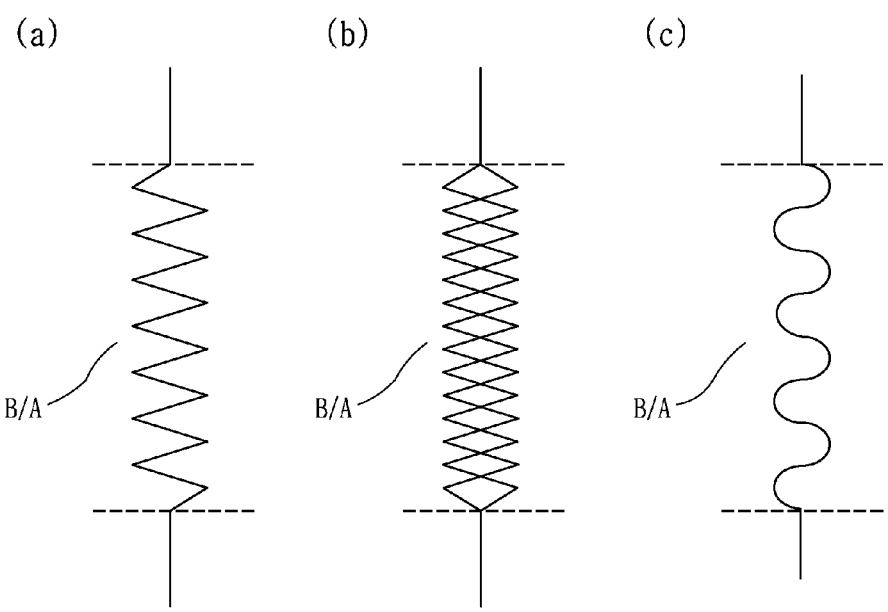
FIG. 11 is a view illustrating various embodiments of FIG. 10.

FIG. 10 is a view illustrating a wire structure in a bending area in a flexible OLED display device according to the present invention, and FIG. 11 is a view illustrating various embodiments of FIG. 10.

In this embodiment, the flexible OLED display device 100 of FIG. 4 will be explained for convenience. However, this embodiment may be also applicable to the flexible OLED display device 200 of FIG. 8.

Referring to FIGS. 4 and 10, in the flexible OLED display device 100, wires may be formed to have a large width for prevention of disconnection thereof due to bending stress in the bending area (B/A) of the lower end non-active area (N/A).

For instance, as shown in FIG. 10, the width (d2) of wires in the bending area (B/A) of the lower end non-active area (N/A) may be greater than the width (d1) of wires in the first area and the second area of the lower end non-active area (N/A).

As shown in FIG. 11, wires are formed, in the bending area (B/A), with a shape such as a triangle, a diamond, a semi-circle and a circle. Thus, disconnection of the wires, due to bending stress occurring when the bending area (B/A) is bent, can be prevented.

That is, in the flexible OLED display device 100, disconnection of wires, which occurs when the bending area (B/A) is bent, can be prevented by various shape changes of the wires in the bending area (B/A). In order to prevent resistance increase of the wires due to the shape changes of the wires, the wires may be formed such that the width in the bending area (B/A) is larger than that in the other regions. As a result, disconnection of the wires, which occurs when the bending area (B/A) is bent, can be prevented.

The aforementioned wires may be power lines including the first ground line 145a and the first driving voltage line 146a, and signal lines including the gate signal line 141a and the data signal line 141b.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A flexible display device comprising:
    a display region including pixels to display images, each of the pixels including an organic light emitting diode (OLED) configured to receive a signal from a signal line and power from a power line to display the images; and
    a non-display region outside the display region where images are not to be displayed, the non-display region including:
        a circuit mount region including therein a driving circuit configured to supply the signal through the signal line and the power through the power line to each of the pixels; and
        a bending region formed between the display region and the circuit mount region and configured to be bent flexibly,
    wherein the signal line and the power line are disposed on a same layer in the bending region, and
    wherein the signal line and the power line are disposed on different layers to overlap each other in the non-display region adjacent to the bending region.

2. The flexible display device of claim 1, wherein the signal line includes at least one of a gate line to supply a gate signal to each of the pixels and a data line to supply a data signal to each of the pixels, and
    wherein the power line includes at least one of a driving voltage line to supply a driving voltage to the OLED, a reference voltage line to supply a reference voltage to the OLED, and a ground voltage line.

3. The flexible display device of claim 1, wherein the signal line and the power line are spaced apart from each other in the bending region.

4. The flexible display device of claim 3, wherein the signal line and the power line are formed in parallel with each other in the bending region.

5. The flexible display device of claim 1, wherein the signal line and the power line do not overlap each other in the bending region relative to a viewpoint from a front side toward a back side of the flexible display device.

6. The flexible display device of claim 1, wherein the signal line and the power line are formed on different layers outside the bending region.

7. The flexible display device of claim 1, wherein a width of the signal line in the bending region is greater than that of the signal line outside the bending region, and
    wherein a width of the power line in the bending region is greater than that of the power line outside the bending region.

8. The flexible display device of claim 1, wherein at least one of the signal line and the power line is formed in a non-straight form in the bending region.

9. The flexible display device of claim 1, wherein the signal line and the power line are formed of a same material.

10. The flexible display device of claim 1, wherein each of the pixels includes a switching transistor connected to the signal line and configured to supply the signal to the OLED and a driving transistor connected to the power line and configured to supply the power to the OLED, and
    wherein an output of the switching transistor is connected to a gate of the driving transistor.

11. The flexible display device of claim 1, wherein the signal line and the power line are commonly formed on a flexible substrate in the bending region.

12. The flexible display device of claim 11, wherein the signal line is formed on the flexible substrate, and the power line is formed on an insulation layer overlying the signal line outside the bending region.

13. A method of preparing a flexible display device, the method comprising:
    disposing a substrate including a display region to display images and a non-display region outside the display region where images are not to be displayed, the non-display region including a circuit mount region and a bending region formed between the display region and the circuit mount region and configured to be bent flexibly;
    forming a signal line and a power line in the display region and the non-display region, the signal line and the power line being disposed on a same layer in the bending region;
    forming pixels to display the images in the display region, each of the pixels including an organic light emitting diode (OLED) configured to receive a signal from the signal line and power from the power line to display the images; and
    disposing, in the circuit mount region, a driving circuit configured to supply the signal through the signal line and the power through the power line to each of the pixels,
    wherein the signal line and the power line are disposed on different layers to overlap each other in the non-display region adjacent to the bending region.

14. The method of claim 13, wherein the step of forming the signal line and the power line includes forming the signal line and the power line of a same material using a same fabrication process in the bending region.

15. The method of claim 13, wherein the step of forming the signal line and the power line includes forming the signal line and the power line to be spaced apart from each other in the bending region.

16. The method of claim 13, wherein the step of forming the signal line and the power line includes forming the signal line and the power line to be disposed in parallel with each other in the bending region.

17. The method of claim 13, wherein the step of forming the signal line and the power line includes forming the signal line and the power line to not overlap each other in the bending region relative to a viewpoint from a front side toward a back side of the flexible display device.

18. The method of claim 13, wherein a width of the signal line in the bending region is greater than that of the signal line outside the bending region, and wherein a width of the power line in the bending region is greater than that of the power line outside the bending region.

19. The method of claim 13, wherein the step of forming the signal line and the power line includes forming at least one of the signal line and the power line in a non-straight form in the bending region.

* * * * *